(12) United States Patent
Barsun et al.

(10) Patent No.: US 6,956,746 B2
(45) Date of Patent: Oct. 18, 2005

(54) ELECTRONIC SYSTEM WITH A MOVABLE PRINTED CIRCUIT ASSEMBLY

(75) Inventors: Stephan K. Barsun, Davis, CA (US); Robert W. Dobbs, Granite Bay, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 47 days.

(21) Appl. No.: 10/600,973

(22) Filed: Jun. 20, 2003

(65) Prior Publication Data

US 2004/0257777 A1 Dec. 23, 2004

(51) Int. Cl.[7] ............................................. H01R 12/16
(52) U.S. Cl. ................. 361/785; 361/740; 361/741; 361/747; 361/756; 361/759; 361/790; 361/801; 361/802; 439/157
(58) Field of Search ................. 361/683–686, 361/728, 736, 740, 741, 742, 747, 748, 752, 361/756, 758, 759, 785, 789, 790, 796, 800, 361/801, 802, 803, 804; 439/157, 74, 310, 439/259

(56) References Cited

U.S. PATENT DOCUMENTS

| | | | |
|---|---|---|---|
| 4,064,551 A | 12/1977 | Lightfoot | |
| 4,197,572 A | 4/1980 | Aimar | |
| 4,313,150 A | 1/1982 | Chu | |
| 5,373,419 A | 12/1994 | Wright | |
| 5,414,594 A | 5/1995 | Hristake | |
| 5,442,520 A | 8/1995 | Kemp et al. | |
| 5,629,836 A | 5/1997 | Wright | |
| 5,781,417 A * | 7/1998 | Albani et al. | 361/801 |
| 6,088,232 A * | 7/2000 | Ho | 361/754 |
| 6,097,591 A | 8/2000 | Ircha | |
| 6,113,402 A * | 9/2000 | Joo | 439/157 |
| 6,147,872 A * | 11/2000 | Roy | 361/754 |
| 6,341,063 B2 | 1/2002 | Kinoshita et al. | |
| 6,373,712 B1 | 4/2002 | Bailis et al. | |
| 6,381,146 B1 * | 4/2002 | Sevier | 361/754 |
| 6,385,053 B1 | 5/2002 | Parizi et al. | |
| 6,406,312 B1 * | 6/2002 | Heitkamp | 439/160 |
| 6,411,517 B1 | 6/2002 | Babin | |
| 6,437,988 B1 | 8/2002 | Treiber et al. | |
| 6,480,391 B1 | 11/2002 | Monson et al. | |
| 6,498,730 B2 | 12/2002 | Centola et al. | |
| 6,522,554 B1 | 2/2003 | Gomez et al. | |
| 6,648,667 B2 * | 11/2003 | Heidenreich et al. | 439/352 |
| 6,791,843 B1 * | 9/2004 | Dobbs et al. | 361/758 |

* cited by examiner

*Primary Examiner*—Phuong T. Vu

(57) ABSTRACT

An electronic system includes a chassis, a first system component coupled to the chassis and having a first connector, a pivot member pivotally coupled to the chassis, a second system component having a second connector configured to mate with the first connector, and a link coupled to the second system component and slidably coupled to the pivoting member. Pivotal movement of the pivoting member moves the first connector and the second connector between a connected state and a disconnected state.

42 Claims, 2 Drawing Sheets

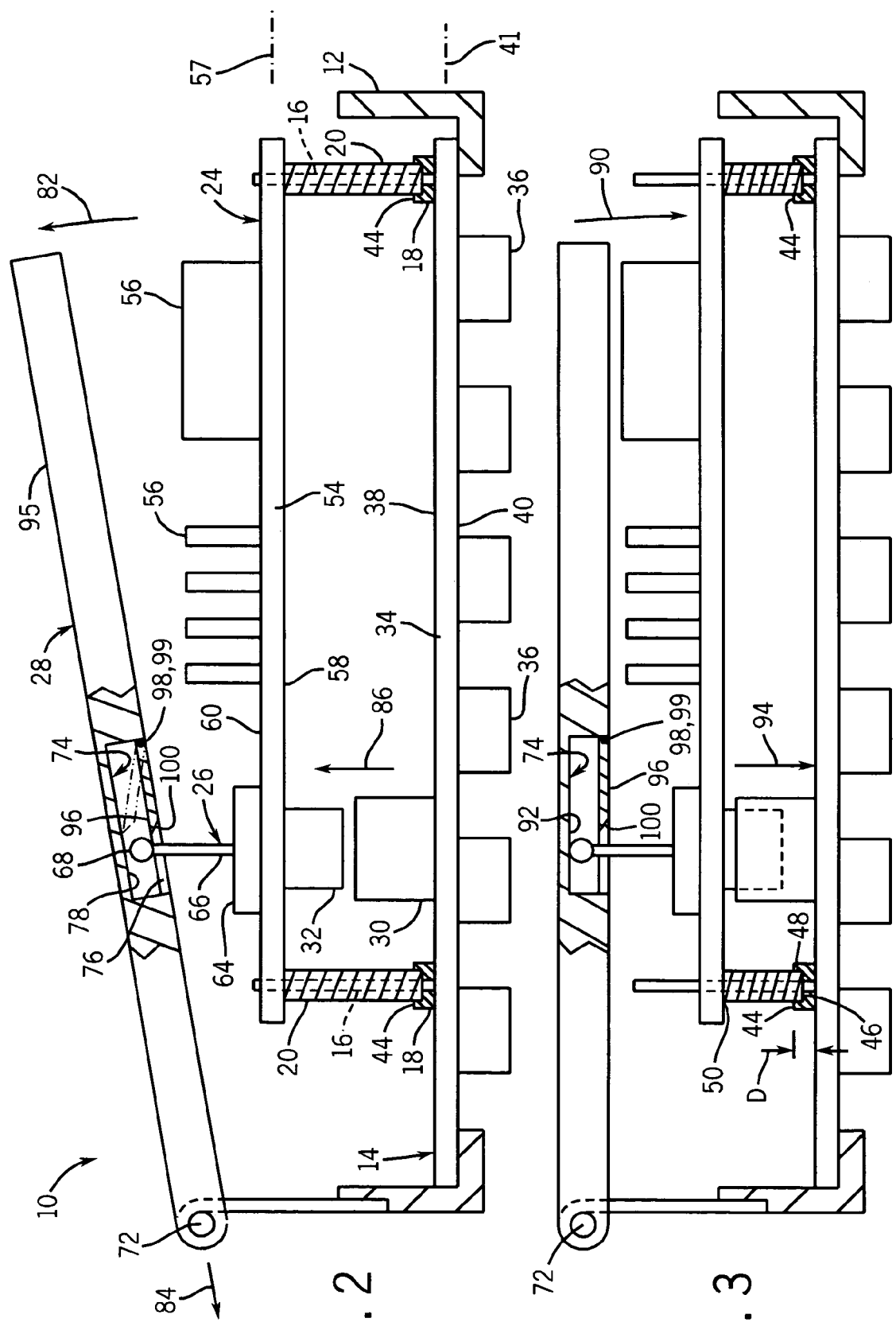

ELECTRONIC SYSTEM WITH A MOVABLE PRINTED CIRCUIT ASSEMBLY

BACKGROUND OF THE INVENTION

Electronic systems, such as computer systems, typically include one or more printed circuit boards upon which are affixed active and passive components. In many systems which utilize a plurality of such printed circuit boards, the printed circuit boards are arranged parallel to one another and are directly connected to one another. In many applications, high density connectors are required to provide adequate connection between the parallel printed circuit boards. Such high density connectors require relatively large amounts of force to ensure proper mating of the connectors. Similarly, large forces are also required to pull apart or unmate the connectors when one of the parallel cards needs to be repaired or replaced.

Connection of the parallel boards is typically accomplished either manually or by using a jack screw. To manually connect the boards, the upper printed circuit board is grasped and lowered so as to position adjacent connectors of the parallel boards in mating engagement. Unfortunately, in many applications the boards are extremely heavy, making assembly difficult and increasing the chance of damage due to misalignment of the connectors or a user's hand slipping and dropping the upper board.

A jack screw typically includes a single screw with mechanical details to allow the jacking screw to push or pull on metal blocks mounted to both printed circuit assemblies and to provide a force to assist in mating or unmating the connectors. Unfortunately, the large mating forces required of high density connectors are difficult to achieve with typical jacking screws. The jacking screw method also typically requires tools which makes assembly and servicing difficult. In addition, both methods fail to keep the assemblies parallel enough to prevent gross and latent defects to the pins and housing of the connector sets or connections to the printed circuit boards.

BRIEF DESCRIPTION OF THE DRAWINGS

FIG. 2 is a sectional view of the electronic system of FIG. 1 taken along line 2—2, illustrating the system component in a disconnected state.

FIG. 3 is a sectional view of the electronic system of FIG. 1 taken along line 2—2, illustrating the system component in a connected state.

DETAILED DESCRIPTION OF THE EXAMPLE EMBODIMENTS

Figure 1:
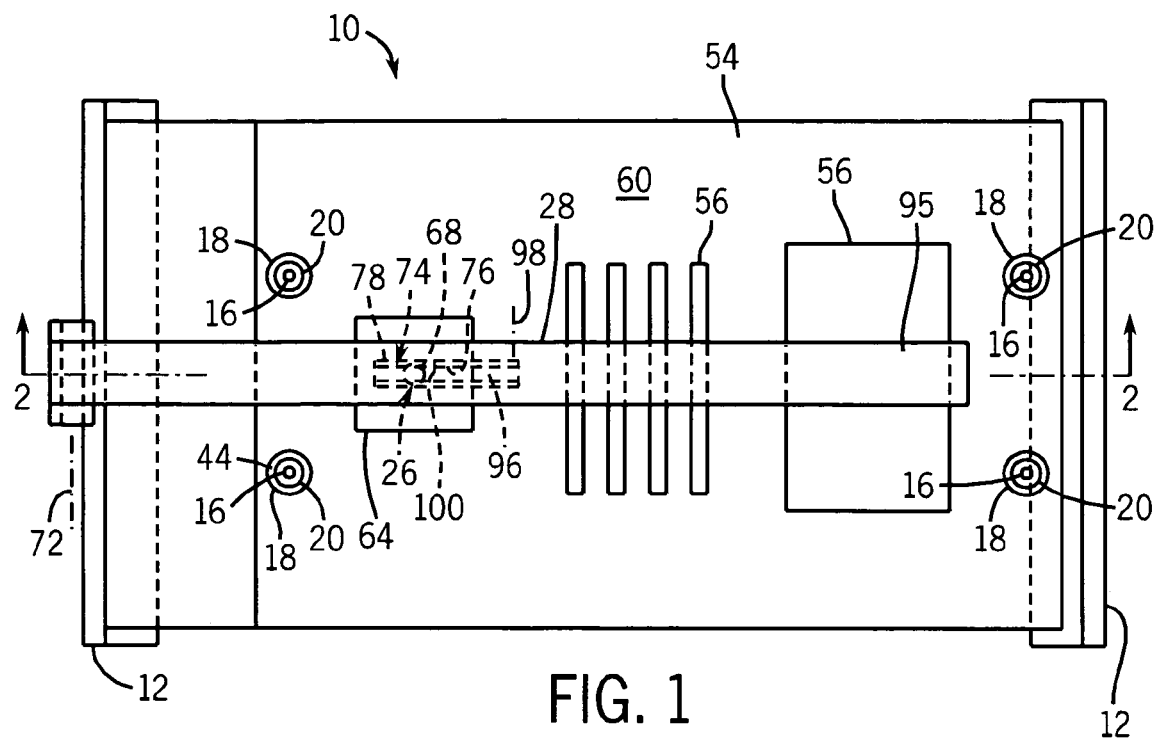
FIG. 1 is a top plane view of an example of an electronic system of the present invention.

FIGS. 1–3 illustrate electronic system 10 which generally includes chassis 12, system component 14, alignment guides 16, members 18, springs 20, system component 24, link 26 and pivoting member 28. Chassis 12, system component 14 and pivoting member 28 form a first part of an electronic system which cooperates with a second part of the electronic system including system component 24 and link 26. Chassis 12 generally comprises a structure including of one or more members configured to support system component 14. In particular embodiments, chassis 12 may additionally be configured to house system component 14 as well as system component 24. Chassis 12 is formed from sheet metal. In alternative embodiments, chassis 12 may be substantially formed from a variety of other materials.

System component 14 generally comprises a main functional component of electronic system 10 that is configured to cooperate with system component 24. To facilitate such cooperation, system component 14 includes connector 30. Connector 30 is configured to connect or mate with an opposite connector 32 of system component 24. In the embodiment illustrated, connector 30 comprises a high density connector. In alternative embodiments, connector 30 may comprise other conventionally known or future developed connectors configured to facilitate the transmission of data signals between system components.

In the particular embodiment illustrated, system component 14 comprises a printed circuit assembly having connector 30. System component 14 additionally includes printed circuit board 34 and one or more components 36. Printed circuit board 34 generally extends along a plane 41. Printed circuit board 34 is stationarily supported relative to chassis 12 and has a face 30 facing system component 24 and an opposite face 40. As shown by FIGS. 2 and 3, connector 30 extends from face 30, while components 36 extend from face 40. Components 36 comprise conventionally known or future developed active or passive components affixed to face 40 of printed circuit board 30. Although not illustrated, additional active or passive components may be affixed to face 30 of printed circuit board 34.

Alignment guides 16 guide movement of system component 24 towards and away from system component 14 to facilitate proper mating of connectors 30 and 32. In the particular embodiment illustrated, alignment guides 16 comprise a plurality of spaced pins slidably passing through system component 24. In alternative embodiments, alignment guides 16 may comprise pins fixed to system component 24 and slidably passing through system component 14, such as through printed circuit board 34. Although system 10 is illustrated as including four spaced alignment guides 16, system component 10 may include a greater or fewer number of such guides. Moreover, although guides 16 are illustrated as generally extending from surface 38 of printed circuit board 34, alignment guides 16 may alternatively extend from chassis 12 through printed circuit board 34 or may extend from chassis 12 about a perimeter of printed circuit board 34. Although alignment guides 16 are illustrated as pins, alignment guides 16 may alternatively comprise various other structures coupled between chassis 12 or other structures stationarily affixed to chassis 12 and system component 24. For example, in alternative embodiments, chassis 12 may include one of a tongue and a groove, while system component 24 includes the other of a tongue and a groove, wherein the tongue and the groove slidably mate to guide movement of system component 24 relative to system component 14.

Stop members 18 comprise members providing stop surfaces 44 configured to abut system component 24 or a surface coupled to system component 24. Stop surfaces 44 generally extend in alignment with a plane at which connector 32 is fully engaged or mated with connector 30. In other words, when connector 32 is fully mated or engaged with connector 30, the lower end of connector 32 is spaced from face 38 by a distance D as shown in FIG. 3. Surface 44 is also spaced from face 38 by the same distance D. Stop surfaces 44 indicate when system component 24 has been moved such that connector 32 is in complete or satisfactory mating engagement with connector 32. Stop surfaces 44 prevent damage to connectors 32 or 30 caused by an individual attempting to move system component 24 too close to system component 14.

Springs 20 generally comprise compression springs having a lower end 46 seated within countersinks 48 formed within members 18 and an upper end 50 bearing against system component 24 or a structure coupled to system component 24. Springs 20 extend about alignment guides 16. Springs 20 provide force to system component 24 based upon weight variances across component 24 to maintain system component 24 in a level orientation as system component 24 is lowered or otherwise moved toward system component 14 and to ensure that connectors 32 and 30 are in proper alignment when joined. Springs 20 have a spring constant such that springs 20 do not provide a substantial force against system component 24 which would inhibit movement of system component 24 towards system component 14 or which would cause disconnection of connectors 32 and 30 once connected.

Although alignment guides 16, stop surfaces 44 and springs, 20 are illustrated as concentrically extending about common axes, each of such elements may be separately provided along system component 14. For example, stop members 18 providing stop surfaces 44 may be spaced from alignment guides 16 and springs 20 may extend along axes distinct from the axes of alignment guides 16 and spaced from members 18.

As shown by FIGS. 2 and 3, springs 20 compress as system component 24 is moved into closer proximity with system component 14. Although less desirable, system 10 may alternatively omit one or more of alignment guides 16, springs 20 or members 18. For example, stop member 18 may be omitted in embodiments wherein spring 20 prevents excessive movement of system component 24 towards system component 14. Springs 20 may be omitted in embodiments where guides 16 maintain a proper orientation of connector 32 during movement of system 24.

System component 24 comprises any one of a variety of main system components having a connector 32 configured to connect to another connector 30 of another system component, such as system component 14. For purposes of this disclosure, a system component is a component which performs one or more functions for an electronic system and which transmits or receives data signals to or from another system component through a pair of mating connectors which releasably connect to one another. In the particular embodiment illustrated, system component 24 comprises a printed circuit assembly including connector 32, printed circuit board 54 and components 56. Printed circuit board 54 has a face 58 from which connector 32 extends. Face 58 faces face 38 of printed circuit board 34. Printed circuit board 54 further includes an opposite face 60 from which components 56 extend. Printed circuit board 54 generally extends along a plane 57 which is parallel to the plane 41 in which printed circuit board 34 extends. Alignment guides 16 and springs 20 further assist in maintaining printed circuit board 54 parallel to printed circuit board 34 as printed circuit board 54 is moved towards printed circuit board 34.

Components 56 comprise conventionally known or future developed active or passive components affixed to surface 60. In alternative embodiments, components 56 may additionally or alternatively be affixed to surface 58 of printed circuit board 54.

Link 26 comprises one or more structures coupled to system component 24 and in slidable engagement with pivot member 28. In the particular embodiment illustrated, link 26 is directly coupled to a stiffener 64 which is coupled to printed circuit board 54. Stiffener 64 extends opposite connector 32 and stiffens board 54 adjacent to connector 32 while providing a rigid structure supporting link 26. Although less desirable, in alternative embodiments, stiffener 64 may be omitted.

As shown by FIG. 2, link 26 includes neck portion 66 and head portion 68. Neck portion 66 and head portion 68 cooperate with pivot member 28 to facilitate slidable movement of link 26 relative to pivot member 28. To assist in maintaining printed circuit board 54 in a level orientation such that printed circuit board 54 remains parallel to printed circuit board 34 during movement of printed circuit board 54, link 26 is coupled to system component 24 at a center of mass of system component 24. Although less desirable, link 26 may alternatively be coupled to system component 24 or other locations.

Pivot member 28 generally comprises an elongate member or lever pivotably supported relative to system component 24 and slidably engaging head portion 68 of link 26. As best shown by FIGS. 2 and 3, pivot member 28 is pivotably coupled to chassis 12 for pivotal movement about axis 72 and includes channel 74. Channel 74 generally comprises an elongate slot, cavity or opening formed within pivot member 28 and configured to slidably receive and capture head portion 68 of link 26. In particular, channel 74 has a narrower constricted portion 76 through which neck portion 66 of link 26 extends. Channel 74 also includes an enlarged chamber 78 which receives head portion 68. Head portion 68 is larger than constricted portion 76 in at least one direction such that head portion 68 is slidably captured within channel 74.

FIGS. 2 and 3 further illustrate the use of pivot member 28 to disconnect and connect connectors 32 and 30, respectively. As shown by FIG. 2, connector 32 is disconnected from connector 30 by pivoting pivot member 28 in the direction indicated by arrow 82 about axis 72. As a result, constricted portion 76 of channel 74 engages the lower surface of head 68 to exert a force upon link 26. As pivot member 28 rotates about axis 72, head 68 slides within channel 74 in the direction indicated by arrow 84. As a result, pivoting of pivot member 28 exerts a force upon link 26 and upon system component 24 in a vertical direction indicated by arrow 86, resulting in connector 32 being lifted from connector 30 in a direction perpendicular to plane 41 of printed circuit board 34.

To connect connector 32 to connector 30, pivot member 28 is pivoted about axis 72 in the direction indicated by arrow 90. This results in surface 92 of channel 74 engaging a top portion of head 68 to exert a force upon link 26. Once again, head portion 68 slides within channel 74 such that the force exerted by pivot member 28 is transmitted to link 26 in the direction indicated by arrow 94 generally perpendicular to the printed circuit board 34. In short, the sliding interaction of link 26 with channel 74 enables force to be applied to connector 32 in directions perpendicular to connector 30 to ensure proper alignment and mating of connectors 32 and 30. Because pivot member 28 provides a lever arm, pivot member 28 multiplies the actual manual force applied by an individual directly to grip portion 95. This larger multiplied force is applied to link 26 and system component 24 to achieve the relatively large mate or unmate forces required of connectors 32 and 30. Electronic system 110 is especially advantageous for mating connectors of parallel printed circuit assemblies which are relatively large, which are difficult to maneuver and manipulate and which usually require high density connectors having extremely large required mate and un-mate forces. Electronic system 10 further facilitates tool-less connection of connectors 32 and 30.

Although pivot member 28 is illustrated as having a channel 74 which extends both above and below head 68 to engage the top surface and the bottom surface of head 68, this slidable relationship between link 26 and pivot member 28 may have other configurations. For example, neck portion 66 of link 26 may additionally include a collar having a diameter greater than neck portion 66 and spaced below head 68, wherein constricted portion 76 is captured between head 68 and the collar. In such an alternative embodiment, a lower surface of constricted portion 76 would engage the collar during pivotal movement of pivot member 28 in the direction indicated by arrow 90, while the upper surface of constricted portion 76 would engage the lower surface of head 68 when pivot member 28 is pivoted in the direction indicated by arrow 82. In such an alternative embodiment, pivot member 28 may alternatively be configured such that link 26 extends completely through pivot member 28.

As further shown by FIGS. 2 and 3, constricted portion 76 additionally includes a spring-loaded gate 96 which pivots about an axis 98. An example of a gate may be a carabiner style gate. Gate 96 pivots about axis 98 provided by a pin 99 between a closed position in which gate 96 rests upon landing 100 and in which head 68 is captured within channel 74 and an open position (shown in phantom) permitting head 68 and neck portion 66 to be withdrawn from channel 74. Gate 96 is biased to the closed position by gravity. In an alternative embodiment, gate 96 may be resiliently biased to the closed position by a spring. For example, a coil spring having one end coupled to gate 96 and the other end coupled to pivot member 28 may be provided. In alternative embodiments, other springs may be employed. Gate 96 permits link 26 to be removed or disconnected from pivot member 28. As a result, system component 24 may also be disconnected from pivot member 28, permitting system component 24 to be repaired and reconnected to pivot member 28 or replaced with another system component which may be connected to pivot member 28 for connection to system component 14. In the particular embodiment illustrated, link 26 is configured as a handle which facilitates manipulation of system component 24 when system component 24 is disconnected from system component 14 and removed from system 10. Although less desirable, link 26 may alternatively be permanently but slidably coupled to pivot member 28.

Figure 4:
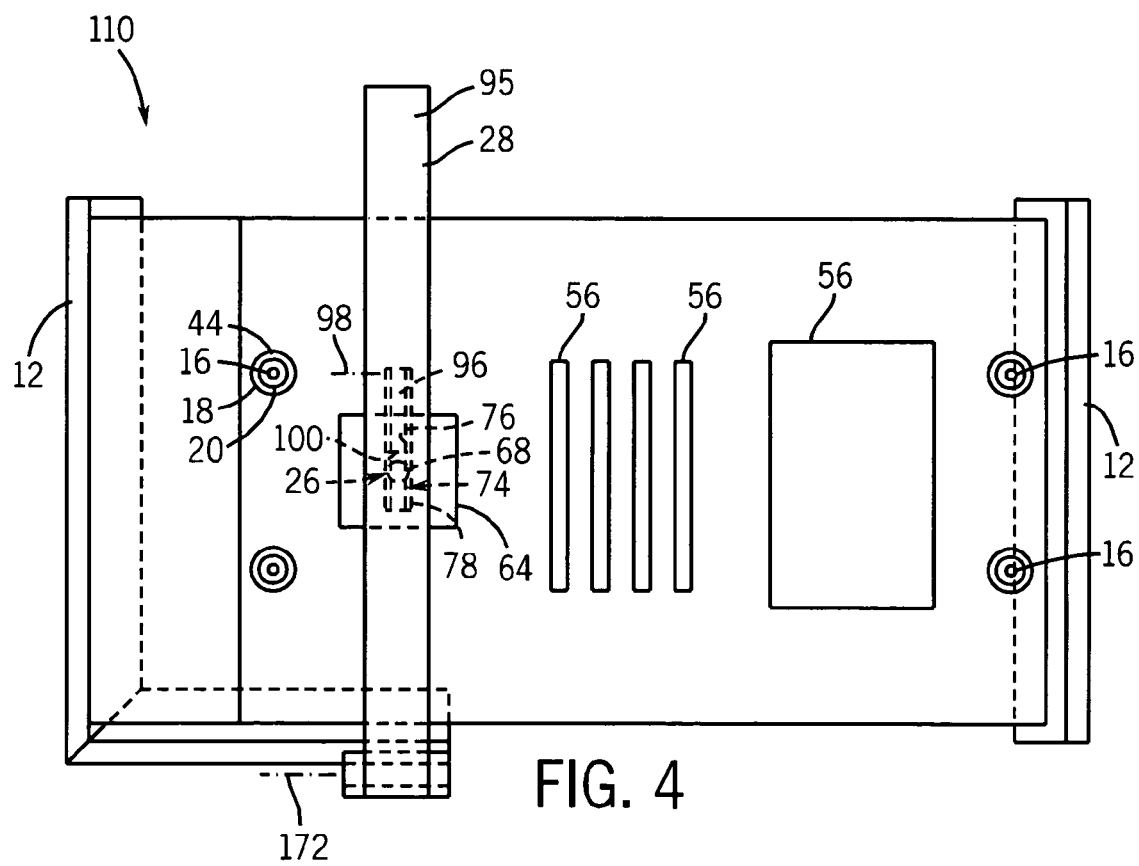
FIG. 4 is a top plane view of an alternative embodiment of the electronic system of FIG. 1.

FIG. 4 is a top plan view of electronic system 110, an alternative embodiment of system 10. Electronic system 110 is substantially identical to system 110 except that pivot member 28 pivots relative to system component 24 about axis 172 in lieu of axis 72 (shown in FIG. 3). Axis 72 generally extends parallel to a longitudinal axis of system components 14 and 26 which are illustrated as printed circuit assemblies. In alternative embodiments, system components 14 and 24 may comprise other conventionally known or future developed system components having connectors which must be connected to one another. Examples of such alternative system components include power supplies, hard disk drives, removable memory drives such as floppy drives, CD/DVD drives and the like. As noted above, electronic system 10 is particularly beneficial in connecting parallel printed circuit assemblies.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. An electronic system comprising:
a chassis;
a pivoting member pivotally coupled to the chassis for rotation about a first axis that is fixed relative to the chassis;
a system component coupled to the chassis and having a first connector;
a first printed circuit assembly having a second connector; and
a link extending between and connecting the first printed circuit assembly and the pivoting member while the second connector is disconnected from the first connector, wherein the link is pivotally coupled to the pivoting member about a second axis parallel to the first axis and wherein pivoting of the pivoting member in a first direction moves the second connector into connection with the first connector and wherein pivoting of the pivoting member in a second direction moves the second connector out of connection with the first connector.

2. The system of claim 1 including at least one guide member extending perpendicular to the first printed circuit assembly in slidable engagement with the first printed circuit assembly, wherein the at least one guide member is configured to guide movement of the first printed circuit assembly towards the system component.

3. The system of claim 2, wherein the at least one guide member includes at least one guide pin in slidable engagement with the first printed circuit assembly.

4. The system of claim 1, wherein the link is releasably coupled to the pivoting member.

5. The system of claim 1, wherein the link has an upper end configured as a handle for the first printed circuit assembly.

6. The system of claim 1 including a stiffener coupled to the first printed circuit assembly between the first printed circuit assembly and the link.

7. The system of claim 1, wherein the second connector extends from a first face of the first printed circuit assembly and wherein the link extends from a second face of the first printed circuit assembly opposite the second connector.

8. The system of claim 1, wherein the first printed circuit assembly has a center of mass and wherein the link is coupled to the first printed circuit assembly at the center of mass.

9. The system of claim 1, wherein the pivoting member includes a channel and wherein the link includes the head portion slidably received within the channel.

10. The system of claim 1, wherein the system component comprises a second printed circuit assembly having the second connector and wherein the first printed circuit assembly and the second printed circuit assembly are configured to face one another while being moved in a direction non-parallel to one another as the second connector is moved into connection with the first connector.

11. The system of claim 10, wherein the first printed circuit assembly is substantially parallel to the second printed circuit assembly as the pivoting member is pivoted.

12. The system of claim 10, wherein the first printed circuit assembly includes a first printed circuit board and a first plurality of components affixed to the first printed circuit board, wherein the first plurality of components extend in a direction away from the second printed circuit assembly.

13. The system of claim 12, wherein the second printed circuit assembly includes a second printed circuit board and a second plurality of components and wherein the second plurality of components extends away from the first printed circuit assembly.

14. The system of claim 1 including a spring coupled between the first printed circuit assembly and the chassis and configured to apply force to the first printed circuit assembly in a direction non-parallel to the first printed circuit assembly.

15. The system of claim 14, wherein the system component comprises a second printed circuit assembly and wherein the spring is configured to maintain the first printed circuit assembly substantially parallel with the second printed circuit assembly.

16. The system of claim 1 including a stop surface configured to engage the first printed circuit assembly to limit movement of the first printed circuit assembly towards the system component.

17. The system of claim 1, wherein the pivot member pivots about a horizontal axis.

18. An electronic subsystem for use with an electronic system having a chassis, a system component coupled to the chassis, and having a first connector and a pivoting member pivotally coupled to the chassis for pivotal movement about an axis, the electronic subsystem comprising:
 a first printed circuit assembly having a second connector; and
 a link coupled to the first printed circuit assembly and adapted to be slidably coupled to the pivoting member such that the link pivots and slides relative to the pivoting member as the pivoting member is pivoted to move the second connector between a connected state in which the second connector is connected to the first connector and the first printed circuit assembly is parallel to the axis and a disconnected state.

19. The electronic subsystem of claim 18, wherein the link is configured to be releasably coupled to the pivoting member.

20. The electronic subsystem of claim 18, wherein the system component comprises a second printed circuit assembly and wherein the first printed circuit assembly is configured to be slidably supported relative to the second printed circuit assembly.

21. The electronic subsystem of claim 18 including a stiffener coupled to the first printed circuit assembly between the first printed circuit assembly and the link.

22. The electronic subsystem of claim 20, wherein the stiffener extends opposite the first connector.

23. The electronic subsystem of claim 18, wherein the first printed circuit assembly has a center of mass and wherein the link is coupled to the first printed circuit assembly at the center of mass.

24. An electronic system for use with an electronic subsystem having a first printed circuit assembly with a first connector and a link extending from the first printed circuit assembly, the electronic system comprising:
 a chassis;
 a system component having a second connector and coupled to the chassis; and
 a pivoting member pivotally coupled to the chassis about an axis, wherein the pivoting member is configured to slidably engage the link during pivoting to move the first connector and the second connector between a connected state in which the first printed circuit assembly is parallel to the axis and a disconnected state.

25. The system of claim 24, wherein the system component comprises a second printed circuit assembly having the second connector.

26. The system of claim 24 including at least one guide member configured to guide movement of the first printed circuit assembly.

27. The system of claim 24 including at least one stop surface configured to engage the first printed circuit assembly to limit movement of the first printed circuit assembly towards the system component.

28. The system of claim 24 including a spring coupled to the chassis and configured to engage the first printed circuit assembly.

29. The system of claim 24, wherein the pivot member is configured to be releasably coupled to the link.

30. The system of claim 24, wherein the pivoting member pivots about a horizontal axis.

31. An electronic system comprising:
 a chassis;
 a first system component having a first connector and coupled to the chassis;
 a pivot member pivotably coupled to the chassis about axis;
 a second system component having a printed circuit assembly and a second connector configured to mate with the first connector; and
 a link coupled to the second system component and slidably coupled to the pivoting member, wherein pivotal movement of the pivoting member moves the first connector and the second connector between a connected state in which the printed circuit assembly extends parallel to the axis and a disconnected state.

32. The system of claim 31, wherein the second system component comprises a printed circuit assembly having the second connector.

33. A method for manipulating a system component of an electronic system, the method comprising:
 providing a link coupled to the system component and slidably coupled to a lever; and
 pivoting the lever about an axis to move the system component in a direction perpendicular to the axis, wherein the first system component comprises a first printed circuit assembly and wherein the electronic system further includes a second printed circuit assembly and wherein the method further includes pivoting the lever about the axis while the first printed circuit assembly is substantially parallel to the second printed circuit assembly.

34. The method of claim 33 including disconnecting the lever from the link.

35. The method of claim 33, wherein the first system component includes a first connector, wherein the system further includes a second system component having a second connector connected to the first connector and wherein the method includes pivoting the lever until the first connector is disconnected from the second connector.

36. The method of claim 35, wherein the first system component includes a first connector, wherein the system further includes a second system component having a second connector disconnected to the first connector and wherein the method includes pivoting the lever until the first connector is connected to the second connector.

37. The method of claim 33, wherein the first system component includes a first connector, wherein the system further includes a second system component having a second connector disconnected to the first connector and wherein the method includes pivoting the lever until the first connector is connected to the second connector.

38. The system of claim 33, wherein the first system component includes a first connector, wherein the system further includes a second system component having a second connector disconnected from the first connector and wherein the method includes pivoting the lever until the first system component engages a stop surface indicating that the first connector and the second connector are in a connected state.

39. The system of claim 1, wherein the pivoting member includes an elongate channel and wherein the link includes a head portion slidably received within the channel so as to slide along at least a portion of the channel.

40. The system of claim 39, wherein the pivoting member includes a gate movable between a closed position in which the head portion is captured within the channel and an open position permitting the head portion to be withdrawn from the channel.

41. An electronic system comprising:
   a chassis;
   a system component coupled to the chassis and having a first connector;
   a first printed circuit assembly having a second connector; and
   a link coupled to the system component and slidably coupled to the pivoting member, wherein pivoting of the pivoting member in a first direction moves the second connector into connection with the first connector and wherein pivoting of the pivoting member in a second direction moves the second connector out of connection with the first connector, wherein the system component comprises a second printed circuit assembly having the second connector and, wherein the first printed circuit assembly is substantially parallel to the second printed circuit assembly as the pivoting member is pivoted.

42. An electronic system comprising:
   a chassis;
   a system component coupled to the chassis and having a first connector;
   a first printed circuit assembly having a second connector;
   a link coupled to the system component and slidably coupled to the pivoting member, wherein pivoting of the pivoting member in a first direction moves the second connector into connection with the first connector and wherein pivoting of the pivoting member in a second direction moves the second connector out of connection with the first connector; and
   a spring coupled between the first printed circuit assembly and the chassis and configured to apply force to the first printed circuit assembly in a direction non-parallel to the first printed circuit assembly, wherein the system component comprises a second printed circuit assembly and wherein the spring is configured to maintain the first printed circuit assembly substantially parallel with the second printed circuit assembly.

* * * * *